United States Patent [19]

Pricer

[11] Patent Number: 5,222,109
[45] Date of Patent: Jun. 22, 1993

[54] ENDURANCE MANAGEMENT FOR SOLID STATE FILES

[75] Inventor: Wilbur D. Pricer, Burlington, Vt.

[73] Assignee: IBM Corporation, Armonk, N.Y.

[21] Appl. No.: 635,910

[22] Filed: Dec. 28, 1990

[51] Int. Cl.[5] .......................... G01B 7/00; G01C 7/00
[52] U.S. Cl. .................................. 377/24.1; 365/189.01
[58] Field of Search ...................... 365/222; 377/24.1

[56] References Cited

U.S. PATENT DOCUMENTS

| | | |
|---|---|---|
| 4,528,683 | 7/1985 | Henry . |
| 4,612,640 | 9/1986 | Mehrotra et al. ............. 371/51 |
| 4,638,457 | 1/1987 | Schrenk ....................... 377/24.1 |
| 4,663,770 | 5/1987 | Murray et al. . |
| 4,682,287 | 7/1987 | Mizuno et al. ............... 377/24.1 |
| 4,803,707 | 2/1989 | Cordan, Jr. . |
| 4,860,228 | 8/1989 | Carroll ......................... 377/24.1 |
| 4,888,686 | 12/1989 | Sinz et al. ..................... 364/200 |
| 4,947,410 | 8/1990 | Lippmann et al. ............ 377/24.1 |
| 5,103,411 | 4/1992 | Shida et al. .................. 377/24.1 |

FOREIGN PATENT DOCUMENTS

3200871A1 7/1983 European Pat. Off. .
0392895 10/1990 European Pat. Off. .
0398654 11/1990 European Pat. Off. .

OTHER PUBLICATIONS

Patent Abstracts of Japan, "Management System For Of Number Of Times Of Writing Programmable Read Only Memory," N. Schinichi, JP-A-62 283 496 (Canon Inc.), Dec. 9, 1987, vol. 012, No. 173 (P-760) Abstract.

Primary Examiner—Eugene R. LaRoche
Assistant Examiner—Viet Q. Nguyen
Attorney, Agent, or Firm—Sughrue Mion Zinn Macpeak & Seas

[57] ABSTRACT

A nonvolatile storage system including several data storage arrays; a counter storage array for storing values indicating the remaining useful life of each of the data storage arrays; and a device for controlling access to each of the data storage arrays as a function of the values stored in each counter array. The counter array has an appreciably longer useful life than any of the data storage arrays.

16 Claims, 2 Drawing Sheets

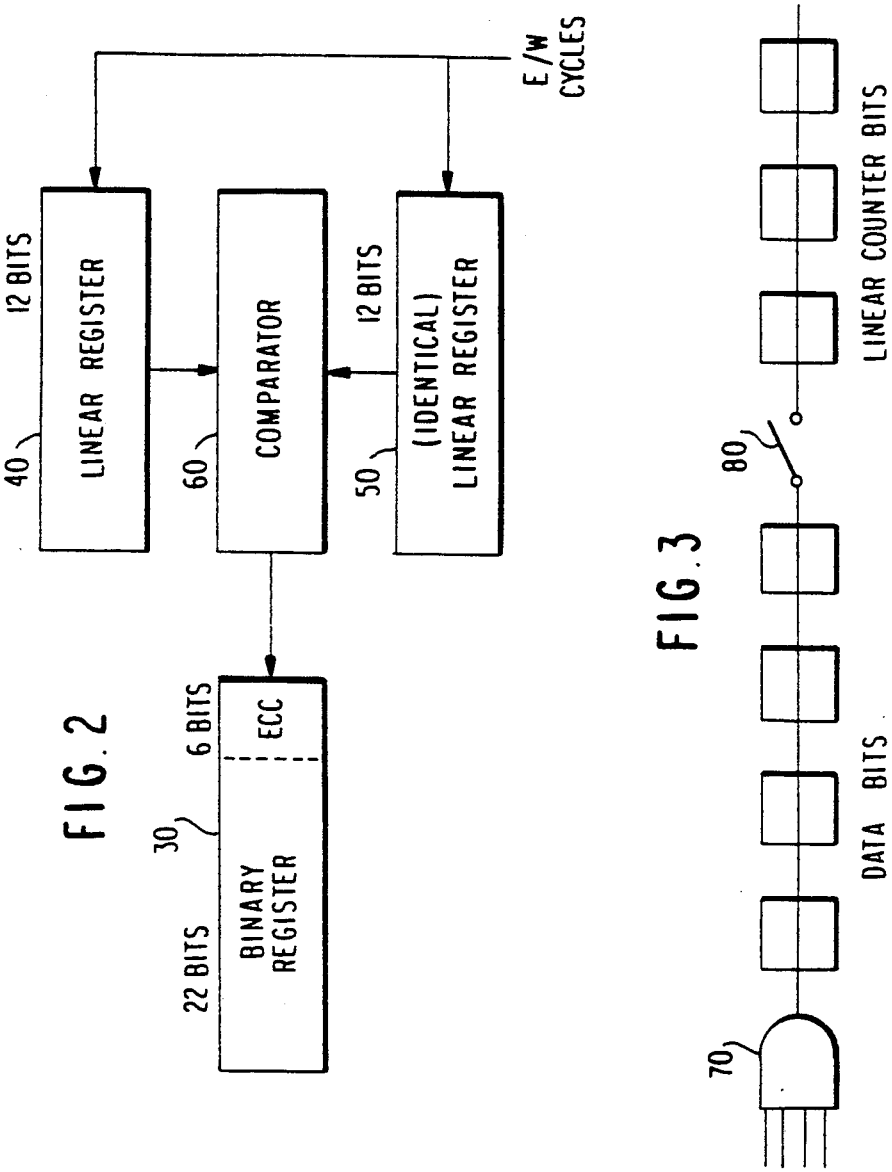
FIG. 2
FIG. 3
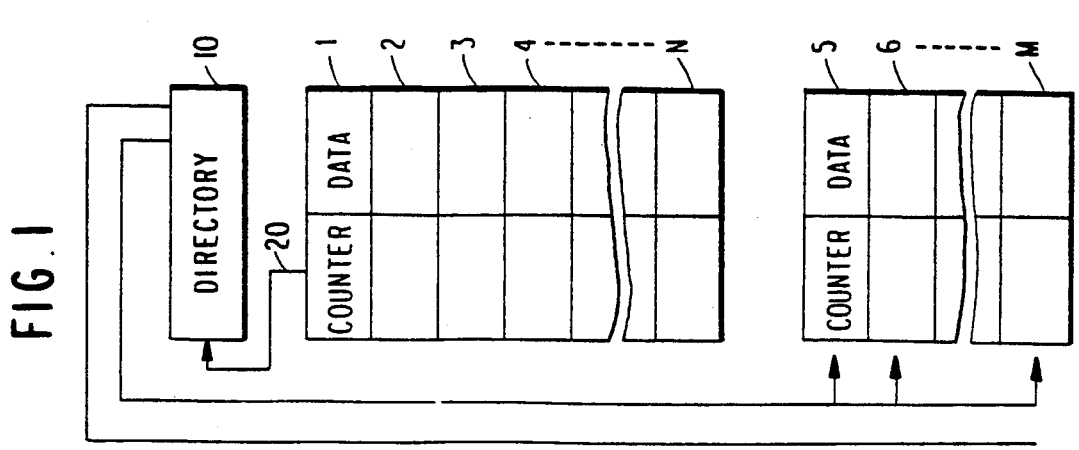
FIG. 1

ENDURANCE MANAGEMENT FOR SOLID STATE FILES

FIELD OF THE INVENTION

The present invention relates to an apparatus and method for counting the number of erase/write cycles that have occurred in nonvolatile files, and for reallocating a file when the counted number of erase/write cycles of the file approaches its endurance limit.

BACKGROUND OF THE INVENTION

The cost per bit of magnetic memory, such as magnetic disks, is decreasing. However, the cost per bit of nonvolatile memory, such as EEPROMs, is decreasing at an even faster rate. Presently, most systems do not employ nonvolatile devices due to their limited endurance, which in the best EEPROM technologies is at most approximately $10^7$ erase/write cycles. This is due to the breakdown of tunneling dielectrics. When nonvolatile devices are employed, severe limitations are placed on the circuit design. Specifically, such a system must be configured to limit the number of erase/write cycles experienced by the nonvolatile devices. The following are examples of such systems.

U.S. Pat. No. 4,803,707 to Cordan Jr. discloses a vehicle odometer system for counting pulses representing vehicle mileage, and for storing the signal count during periods when the vehicle power is disabled. In this system, a group of nonvolatile memory cells is used to store binary values for odometer readings up to 10,000 miles. For odometer readings greater than 10,000, a new set of memory cells is accessed. Thus, each group of memory cells is cycled up to only 10,000 times which is below the endurance limit. The higher order bits of each memory block, which are not cycled as often as the lower-order bits, serve as a pointer for the new set of memory cells.

In order to ensure the integrity of the stored data, this system requires that each group of nonvolatile memory cells be reallocated well below the maximum endurance limit of the cells. However, such a reallocation scheme is not practical in a system containing a large number memory blocks because the memory blocks would be reallocated too often.

U.S. Pat. No. 4,528,683 to Henry discloses an odometer system which employs a highly particularized five-bit word per decimal position counting scheme, along with a multi-level multiplexer to move the decimal ones, tens, hundreds and thousands position through a nonvolatile memory array. This system allows erase/cycle "wear" effects of the cells to be spread throughout the memory array, thereby preventing any one group of cells from wearing out too quickly.

U.S. Pat. No. 4,663,770 to Murray et al discloses a system including nonvolatile counter devices. In order to distribute the erase/write cycle wear effects among the various counter devices, counter usage is successively shifted. While the scheme of this system allows for distribution of the erase/write wear effects among the nonvolatile devices within the system, the coding and decoding for this distribution requires a complex hardware configuration.

SUMMARY OF THE INVENTION

It is an object of the invention to provide a nonvolatile memory system containing a large number of primary large memory blocks, and a minimum number of identical "substitutional" or reallocation memory blocks.

It is another object of the invention to provide a system which utilizes nonvolatile devices and which is relatively simple in design.

It is still another object of the invention to provide a system which ensures the integrity of data stored in nonvolatile memory even though the memory is subjected to a large number of erase/write cycles.

The present invention accomplishes these and other objects by counting the number of erase/write cycles that a nonvolatile data block experiences, and reallocating the data block when the counted number of erase/write cycles approaches a predetermined number representing the endurance limit of the nonvolatile data block.

BRIEF DESCRIPTION OF THE DRAWING

FIG. 1 is a block diagram showing a memory system according to the invention.

FIG. 2 is a block diagram of a counter utilized in the system shown in FIG. 1.

FIG. 3 is a circuit block diagram for illustrating a counting operation according to the invention.

PREFERRED EMBODIMENTS OF THE INVENTION

Figure 4:
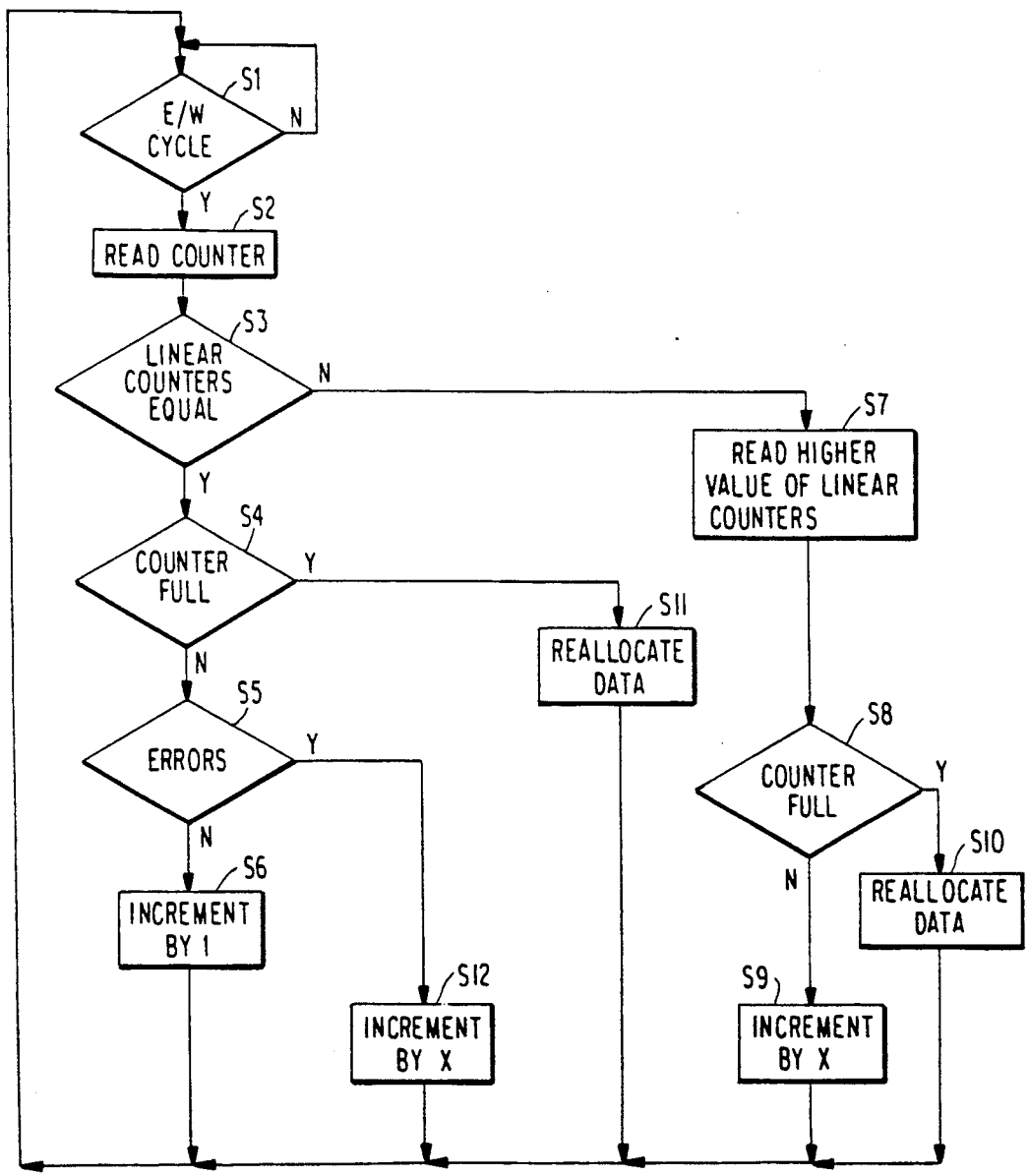
FIG. 4 is a flowchart showing the operation according to the invention.

As shown in FIG. 1, the memory system according to the invention includes several primary counter/data registers 1, 2, 3, 4, ... N, several substitutional counter/data registers 5, 6, ... M; and a directory processor 10.

Each of the primary and substitutional counter/data registers includes a large nonvolatile memory block, e.g., which contains $2 \times 10^3$ bytes, and a counter for counting each erase/write cycle that the associated memory block experiences. During an erase/write cycle for a particular memory block, the counter associated with that particular memory block is first read. If the read count is below a predetermined number, such as $1.0 \times 10^7$ which is the erase/write cycle endurance limit for a nonvolatile memory block, then the counter is incremented by one. However, if the read count is above the erase/write cycle endurance limit, then the counter outputs a reallocation signal, via signal line 20, to the directory processor 10 indicating that the memory block should be reallocated. Upon receiving the reallocation signal from a counter, the directory processor 10 downloads the data in the memory block, whose erase/write cycle endurance limit has been reached, into one of the substitutional counter/data registers 5, 6,...M which has not yet been accessed, i.e., subjected to any erase/write cycles. Since the substitutional counter/data register has not yet been previously accessed, the reallocated data can now be safely subjected to another $1.0 \times 10^7$ erase/write cycles.

The directory processor 10 functions to keep track of which primary and substitutional counter/data registers contain data. For example, if primary counter/data register 1 sends a reallocation signal to the directory processor 10, the directory processor 10 will determine which of the substitutional counter/data registers 5,6 ... M do not contain data, i.e., have not been accessed. If, for example, substitutional counter/data register 6 has not been accessed, then the directory processor 10 will reallocate the data from primary counter/data register 1 to the substitutional counter/data register 6. The address of counter/data register 6 will now serve as the address for the data previously stored in primary counter/data register 1.

FIG. 2 shows the counter of the counter/data registers in greater detail. As shown in FIG. 2, the counter includes a twenty-eight bit binary register 30 which stores the high-order bits of the counted data, a pair of nonvolatile linear registers 40 and 50 which store the lower-order bits of the counted data, and a comparator 60 for comparing the data stored in the linear registers 40 and 50.

The binary register includes twenty-two bits for storing data, and six-bits for an ECC (Error Correction Code). Each of the linear registers stores twelve-bits of counted data. The following Table exemplifies the count sequence of the counter shown in FIG. 2 between erase/write cycles N and N+4.

| E/W Cycle | Binary Register | Linear Registers |
|---|---|---|
| N | 10010 | 000111 |
| N + 1 | 10010 | 001111 |
| N + 2 | 10010 | 011111 |
| N + 3 | 10010 | 111111 |
| N + 4 | 10011 | 000000 |

In this example, the nonvolatile counter bits experience 1/12 as many erase/write cycles as do the data bits, and therefore the counter bits do not deteriorate as quickly as do the data bits of the associated memory block, thereby ensuring an accurate count of the number of erase/write cycles of the associated data block.

In FIG. 2 the comparator 60 compares the data contained in the linear registers 40 and 50. Since the linear registers 40, 50 are identical and count the same erase/write cycles, the counted data contained therein should always be the same. However, in the event of an error in either of the two linear registers, the higher count is assumed correct. In the event of an error in the binary register, the error is corrected by the ECC. This technique could be extended to higher orders of redundancy, if desired.

FIG. 3 shows the operation of counting the linear registers. The data bits are directly connected to a driver 70, and the linear counter bits are connected to the driver 70 via the data bits and a switch 80. During all accesses, the counter bits are read first. During the erase portion of the erase/write cycle, if the linear counters are not full, the linear counter bits will be disconnected from the driver 70 by operating switch 80 to the "UP" position, as shown in FIG. 3. During the write portion of the cycle, only the next linear bit will be written. If the linear counter bits are full, then the counter bits will remain connected to the driver for the entire erase/write cycle by operating switch 80 to the "DOWN" position. During the erase/write cycle, the linear register will be reset to all zeros, and the binary counter counted-up by one.

FIG. 4 shows the operation of the memory system. As shown in FIG. 4, it is first determined in step S1 whether or not an erase/write cycle has been requested for a particular data block. If an erase/write cycle has been requested, then the counter associated with that particular memory block is read at step S2. The linear registers 40 and 50 are then compared at step S3 to determine if they are equal to each other. As indicated above, the linear registers 40 and 50 are identical, and should always contain the same data. If it is determined in step S3 that the linear registers 40 and 50 are equal to each other, then the process proceeds to step S4 where it is determined whether the counter is full, i.e., whether the counter has reached the predetermined endurance limit of the memory block. If it is determined that the counter is not full at step S4, then the process proceeds to step S5 where it is determined whether or not any error has occurred by examining the ECC of the binary register. If it is determined that no errors have occurred, then the counter is incremented by 1, and the process proceeds back to step S1.

If in step S3 it is determined that the linear registers 40 and 50 are not equal to each other, then it is assumed that an error has occurred, and the process proceeds to step S7 where the higher data count of the two registers is taken as the correct count. The process then proceeds to step S8 where it is determined whether or not the counter is full. If the counter is not full, then the process proceeds to step S9 where the counter is incremented by a value X which is some significant fraction of the counter's full capacity, because it was determined in step S3 that an error occurred, i.e., the linear registers were not equal to each other in step S3. Such an error may mean that the nonvolatile memory cells are beginning to wear out. By incrementing the counter by the value X, the count is significantly increased. As a result, the memory block associated with the counter will be reallocated sooner.

If in steps S4 or S8 it is determined that the counter is full, then the data contained in the memory block is reallocated to an empty or spare substitutional data/counter memory block, as discussed above. If in step S5 it is determined from the ECC that an error has occurred, then the count is incremented by the value X. Again, since an error has occurred, this may mean that the nonvolatile memory cells are beginning to wear out. By incrementing the counter with the value X which is some significant fraction of the total count, the data contained in the associated data block will be reallocated sooner.

In another embodiment of the invention, the linear registers are replaced with a random number generator programmed to generate an output having a one-in-twelve chance of being a "1" or HIGH output in any erase/write cycle. Upon generation of a "1" output, the binary register would be counted-up. While in this embodiment the exact count of the write/erase cycles would no longer be absolutely correct, the count would be statistically accurate enough. Alternatively, the random number generator may be a pseudo-random number generator such a linear feedback shift register of long prime number length, properly weighted.

In another embodiment of the invention, the nonvolatile memory blocks are tested by subjecting the memory blocks to relatively short erase/write cycles to determine which memory blocks are likely to fail first, and which memory blocks have a better than average endurance to erase/write cycles. Those memory blocks which are likely to fail first could be loaded with a pre-count so that if these blocks are subjected to substantially more than average usage, the blocks would be reallocated early, i.e., earlier than if the counter was not loaded with a pre-count. On the other hand, those memory blocks determined to have a better than average endurance to erase/write cycles could be used as substitutional blocks. These high endurance memory blocks would later be substituted for high usage addresses.

Thus, the strongest storage cells would subsequently be used for the highest usage addresses. Further, the counters of the system could be combined with a redundancy bad-block scheme wherein those memory blocks determined to have extremely poor endurance to erase/write cycles are preloaded with a full count. This could be done when the memory is first manufactured, or later on a periodic basis during use.

In another embodiment of the invention, the counters store count values corresponding to endurance-limiting phenomena other than numbers of erase/write cycles. For example, a sensor could be used to indicate that the memory is being stressed by the application of high power surges or voltages, or other temporary endurance-detracting environmental conditions such as high temperatures. A count could be generated that varies as a function of the amount of time the stress conditions are experienced, the absolute value of such stress conditions, and the count already stored in the counter (i.e., as the counter value increases, the above stress conditions will have a greater effect upon endurance). Another alternative is to generate counts that reflect other more permanent environmental endurance detractors, such as high humidity, low pressure, ambients having high particulate counts, etc. Another alternative is to monitor the validity of the data from the memory using error correction codes (ECC) to increment the counter for memory blocks experiencing soft errors. Again, the count could be weighed such that the count is higher as the number of soft errors increases, or as the soft errors occur later in time. Yet another alternative is to identify "key" memory blocks that will be used most often and/or will store critical information. The counters associated with these blocks could be incremented prior to or during memory usage, without the occurrence of endurance-limiting phenomena. As such, the accesses would be diverted from such blocks earlier than the remaining blocks, further insuring the integrity of the stored data.

In another embodiment of the invention, the functions of the directory processor 10 are combined in the counters. It is noted that the number stored in the counter is useless once a full count is obtained. The functions of the directory processor 10 can be combined in the counters by including, for example, three additional bits for each counter. These bits could indicate when the count is full, and by implication when other counter bits are to be used for other purposes. When the counter is full, as indicated by the stored code in these three bits, then the other bits in the counter can serve as a pointer for indicating which substitutional block is to be addressed.

What is claimed is:

1. A nonvolatile storage means comprising:
   a plurality of data storage registers;
   at least one counter means for storing values indicating the remaining useful life of each of said plurality of data storage registers; and
   means for controlling access to each of said plurality of data storage registers as a function of the values stored in said at least one counter means, said at least one counter means having an appreciably longer useful life than any of said plurality of data storage registers.

2. A nonvolatile memory system, comprising:
   a plurality of nonvolatile memory blocks each having a plurality of memory cells, at least one of said plurality of nonvolatile memory blocks containing no data and not having been previously accessed;
   at least one counter means for counting a number of erase/write cycles that each of the plurality of nonvolatile memory blocks experience; and
   means, coupled to said at least one counter means, for reallocating data contained in a first memory block to said at least one memory block when the at least one counter means counts, for said first memory block, up to a predetermined value.

3. The system according to claim 2, wherein said predetermined value represents a predetermined endurance limit of each of said nonvolatile memory cell blocks.

4. The system according to claim 2, wherein there are a plurality of counter means, and wherein each of said plurality of counter means comprising a first nonvolatile counter and a second nonvolatile counter.

5. The system according to claim 4, wherein each of said plurality of counter means further comprises a third nonvolatile counter.

6. The system according to claim 5, wherein each of said plurality of counter means further comprises an associated comparator means for comparing the data contained in said second and third nonvolatile counters with each other.

7. The system according to claim 6, further comprising means for incrementing one of said plurality of counter means by one when its associated comparator means determines that the second and third nonvolatile counters are equal to each other, and for incrementing said one counter means by a predetermined value which is substantially greater than one when said associated comparator means determines that said second and third nonvolatile counters are not equal to each other.

8. The system according to claim 2, wherein each of said plurality of counter means comprises a binary counter and a random number generator.

9. A method for counting a number of erase/write cycles of a nonvolatile memory system including a plurality of nonvolatile memory blocks, at least one of said plurality of nonvolatile memory blocks containing no data and not having been previously accessed, the method comprising:
   counting a number of erase/write cycles that the plurality of nonvolatile memory blocks experience, respectively; and
   reallocating data contained in a first memory block to said at least one memory block when the counted number of erase/write cycles of said first memory block is equal to a predetermined value.

10. The method according to claim 9, wherein said predetermined value represents a predetermined endurance limit of nonvolatile memory cells of each of said memory blocks.

11. The method according to claim 9, further comprising the steps of determining any errors in the nonvolatile memory system, and incrementing the counted number of erase/write cycles by one if no errors are determined.

12. The method according to claim 11, further comprising the steps of determining any errors in the nonvolatile memory system, and incrementing the counted number of erase/write cycles by a number substantially greater than one if any errors are determined.

13. The method according to claim 9, further comprising the step of determining which nonvolatile memory blocks have a high endurance to erase/write cycles and which nonvolatile memory blocks have a low endurance to erase/write cycles.

14. The method according to claim 13, further comprising the step of preloading the counter associated with low endurance memory blocks with a count which is substantially greater than one.

15. The method according to claim 13, further comprising the step of designating at least one of the determined high endurance memory blocks as said at least one memory block which contains no data.

16. The nonvolatile storage means as defined in claim 1, wherein the remaining useful life of each of said plurality of storage registers represents a number of remaining erase/write cycles that each of said plurality of storage registers can experience.

* * * * *